United States Patent [19]

Chang et al.

[11] Patent Number: 5,034,783
[45] Date of Patent: Jul. 23, 1991

[54] SEMICONDUCTOR DEVICE INCLUDING CASCADABLE POLARIZATION INDEPENDENT HETEROSTRUCTURE

[75] Inventors: Tao-Yuan Chang, Lincroft; Jane E. Zucker, Aberdeen, both of N.J.

[73] Assignee: AT&T Bell Laboratories, Murray Hill, N.J.

[21] Appl. No.: 558,940

[22] Filed: Jul. 27, 1990

[51] Int. Cl.[5] .......................................... H01L 29/161
[52] U.S. Cl. .......................................... 357/16; 357/4; 357/19; 357/30; 357/90; 357/58; 350/96.12; 350/96.14; 350/96.18
[58] Field of Search .................... 357/16, 4, 19, 30 E, 357/90, 58; 350/96.12, 96.18, 96.14

[56] References Cited

PUBLICATIONS

Miller et al, "Parabolic Quantum Wells with the GaAs-$Al_xGa_{1-x}As$ System", *Physical Review B*, vol. 29, No. 6, Mar. 15, 1984, pp. 3740–3743.

Drummond et al, "Quantum–Tailored Solid-State Devices", *IEEE Spectrum*, Jun. 1988, pp. 33–37.

Lee et al, "High Quality $In_{0.53}Ga_{0.47}As$ Schottky Diode Formed by Graded Superlattice of $In_{0.53}Ga_{0.47}As/In_{0.52}Al_{0.48}As$", *Appl. Phys. Lett.*, 54(19), May 8, 1989, 1863–5.

Chang et al, "Novel Modulator Structure Permitting Synchronous Band Filling of Multiple Quantum Wells and Extremely Large Phase Shifts," IEDM 1989, CH2637-7/89/0000-0737, pp. 737–740.

Wegener et al, "Electroabsorption and Refraction by Electron Transfer in Asymmetric Modulation–Doped Multiple Quantum Structures," *Appl. Phys. Lett.* 55(6), Aug. 7, 1989, pp. 583–585.

Zucker et al, "Large Refractive Index Changes in Tunable–Electron–Density InGaAs/InAlAs Quantum Wells," *IEEE Photonics Technology Letters*, vol. 2, No. 1, Jan. 1990, pp. 29–31.

Wegener et al, "Absorption and Refraction Spectroscopy of a Tunable–Electron–Density Quantum–Well and Reservoir Structure," *Physical Rev. B*, vol. 41, No. 5, Feb. 15, 1990, pp. 3097–3104.

*Primary Examiner*—William Mintel
*Attorney, Agent, or Firm*—Gregory C. Ranieri

[57] ABSTRACT

Polarization independence and higher intrinsic speed resulting from lowered device capacitance are achieved in a modulation-doped semiconductor heterostructure wherein a transfer barrier region including a graded bandgap semiconductor layer facilitates flow of carriers (electrons) from a doped reservoir to a narrow bandgap active region while an isolation barrier region confines carrier flow to be substantially within the graded bandgap region and the associated active region to minimize leakage current. The present modulation-doped heterostructure exhibits substantially equal end-boundary conditions in an unbiased condition for efficient cascading or stacking with additional modulation-doped heterostructures. Several embodiments of the present invention are described in which grading in the transfer barrier region is shown to include substantially continuous compositional grading, stepwise compositional grading, and superlattice grading. In these embodiments, the thickness of the active region is determined in proportion to the size of the optical effect which is to be produced.

20 Claims, 5 Drawing Sheets

SEMICONDUCTOR DEVICE INCLUDING CASCADABLE POLARIZATION INDEPENDENT HETEROSTRUCTURE

TECHNICAL FIELD

This invention relates to semiconductor devices and, more particularly, to semiconductor devices including a modulation-doped heterostructure.

BACKGROUND OF THE INVENTION

Optical processing applications in lightwave communications, optical computing and photonic switching are creating a need for high speed, high performance optical and photonic devices such as modulators and the like. While modulation-doped quantum well structures have been developed for such applications, the structures have relatively long charge depletion time which limits the fundamental or intrinsic speed of operation of the device. Quantum wells are understood in practice as being a narrow energy bandgap material layer sandwiched between wider energy bandgap material layers wherein the thickness of the narrow energy bandgap material layer is much less than twice the exciton Bohr radius ($<<2a_0$) for the narrow energy bandgap material. In GaAs, for example, a narrow bandgap material layer between two wider bandgap material layers is considered a quantum well when its thickness is less than 300 Å.

Modulation-doped quantum well heterostructures have been presented in which the heterostructures are cascadable in a semiconductor device to achieve high speed operation while obtaining large optical effects such as index of refraction or absorption coefficient changes for modulating lightwave signals without significant increases in the operating potentials over prior quantum well structures. Each modulation-doped quantum well heterostructure exhibits substantially equal boundary conditions with respect to each end of the heterostructure in an unbiased condition for efficient cascading or stacking. Each quantum well is said to be in the active region of the heterostructure and has associated with it both an isolation barrier layer to minimize leakage current and, through a transfer barrier, a separate charge reservoir. The latter aspect contributes to the speed of the cascadable quantum well heterostructure. See, for example, an article describing this quantum well heterostructure by Wegener et al. in *Phys. Rev. B.*, Vol. 41, pp. 3097–3104 (1990).

In contrast to former quantum well devices, the cascaded modulation-doped quantum well heterostructures are synchronously or substantially simultaneously depleted in the presence of a bias potential which tends to reduce the overall switching potentials. When incorporated within a waveguide structure, cascaded modulation-doped quantum well heterostructures can be used as a waveguide element or as an intra-cavity element such as a modulator for directly modulated light source. Due to relatively large electrically induced changes in optical characteristics, it is possible to fabricate short waveguide structures to produce a relatively large change in optical characteristics. While many attributes of the modulation-doped quantum well heterostructure device are appealing, it should be noted that any device incorporating quantum wells is polarization sensitive or, alternatively, polarization dependent as a result of valence band splitting associated with quantum wells. This presents possible problems for lightwave communication system applications. It should be noted that the valence band splitting occurs when the quantum layer thickness is significantly less than twice the exciton Bohr radius. Moreover, in order to deplete the quantum well of electrons, it is necessary to have the electrons surmount a finite potential barrier (a transfer barrier) which limits the ultimate speed of the device. The latter aspect is more noticeable when depleting carriers from each quantum well rather than supplying carriers to each quantum well.

SUMMARY OF THE INVENTION

Polarization independence and higher intrinsic speed resulting from lowered device capacitance are achieved in a modulation-doped semiconductor heterostructure wherein a transfer barrier region including a graded bandgap semiconductor layer facilitates flow of carriers (electrons) from a doped reservoir to a narrow bandgap active region while an isolation barrier region confines carrier flow to be substantially within the graded bandgap region and the associated active region to minimize leakage current. The present modulation-doped heterostructure exhibits substantially equal end-boundary conditions in an unbiased condition for efficient cascading or stacking with additional modulation-doped heterostructures.

Several embodiments of the present invention are described in which grading in the transfer barrier region is shown to include substantially continuous compositional grading, stepwise compositional grading, and superlattice grading. In these embodiments, the thickness of the active region is determined in proportion to the size of the optical effect which is to be produced.

In another embodiment, it is shown that an active region comprising narrow energy bandgap material whose thickness is greater than twice the exciton Bohr radius for the respective material provides polarization independent operation whether the active layer energy bandgap is matched or not to the transfer barrier region energy bandgap.

Cascadability of the heterostructures allows large index of refraction or absorption coefficient changes for modulating lightwave signals without significant increases in the operating potentials. When incorporated within a waveguide structure, the present cascadable modulation-doped heterostructures can act as an external modulator, or as an intra-cavity wavelength tuning element, or as an intracavity modulator, or even as an optically-pumped laser.

BRIEF DESCRIPTION OF THE DRAWING

The present invention, together with its features and advantages, may be more readily understood from the following detailed description taken in conjunction with the accompanying drawing of several illustrative embodiments, in which.

The various exemplary embodiments of the invention shown in the FIGS. are intentionally not been drawn to scale. This has been done for purposes of illustration and clarity of exposition. Exemplary dimensions of semiconductor layers shown in the FIGS. are stated in the description hereinbelow.

DETAILED DESCRIPTION

Fundamentally, the modulation-doped heterostructure (n-i-n) is considered a basic semiconductor building block which is synchronously and simultaneously controllable with other heterostructures in the same cascaded array. This basic building block is realized as a charge carrier reservoir in substantially close proximity to an active layer wherein the reservoir and active layers are bounded by isolation barrier layers from the associated and adjacent heterostructure. A transfer barrier region is interposed between the reservoir and active layers to facilitate carrier flow between the reservoir and the active layer. Cascadability arises from the further limitation that the heterostructure exhibit substantially equal boundary conditions at each end thereof.

Cascadable modulation-doped heterostructures offer many interesting alternatives for device structures which may be included in opto-electronic integrated circuits. While many different device structures are possible, the description below focuses primarily on a waveguide structure having a waveguiding region surrounded at least on top and bottom surfaces by appropriate cladding regions. Modulation-doped heterostructures are cascadable in accordance with the principles of the invention to realize the waveguiding region of the devices shown in the FIGS. It should be noted that the structures presented in the FIGS. are merely for purposes of illustration and not for purposes of limitation.

Figure 1:
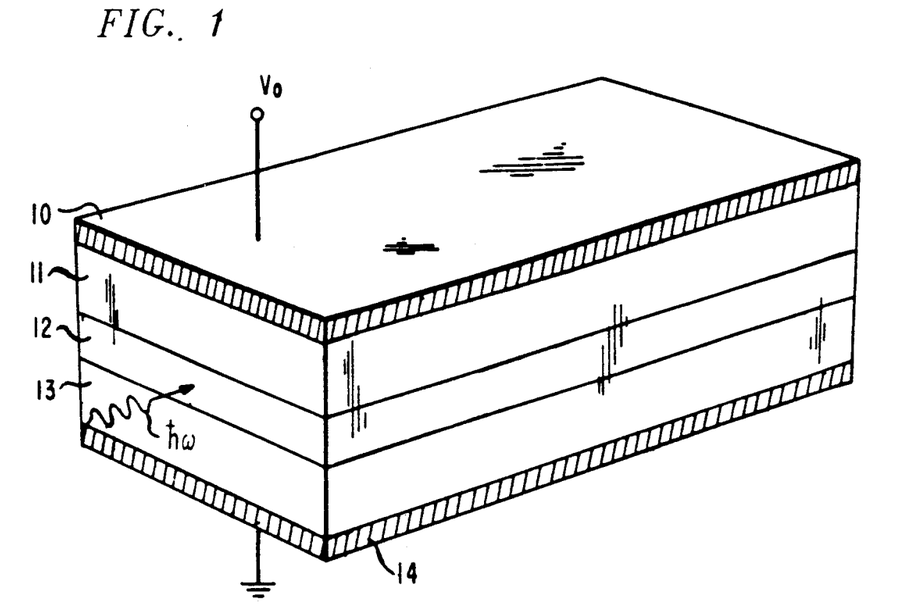
FIG. 1 is a perspective view of a waveguide device incorporating polarization independent cascadable modulation-doped heterostructures in the waveguiding layer.

FIG. 1 shows a perspective view of a semiconductor planar waveguide device having a waveguiding region 12 surrounded at least on top and bottom surfaces by cladding regions 11 and 13, respectively. Details of the various semiconductor layers which comprise the semiconductor waveguide device of FIG. 1 will be discussed in more detail below, particularly, with respect to FIGS. 4-10. Electrodes contact the semiconductor waveguide device via the cladding regions. Electrical contact for biasing at potential $V_0$ is made to electrodes 10 and 14. Light having a mean photon energy $h\omega$ impinges on the device in a direction parallel to the longitudinal axis of the waveguide region. A variation of the applied bias potential results in a corresponding change of the absorption coefficient or index of refraction. As a result, the semiconductor waveguide device may be switched rapidly between highly absorbing and highly transmissive states for amplitude or intensity modulation. This is particularly useful when the mean photon energy of the light $h\omega$ in the waveguide is greater than the energy of the absorption band edge for a modulation-doped heterostructure. Similarly, the index of refraction for the semiconductor waveguide device may be varied to increase or decrease the effective optical path length of the waveguide. Generally, index variations are employed for frequency or phase modulation applications. This is particularly useful when the mean photon energy of the light $h\omega$ in the waveguide is below the energy of the absorption band edge of the active region (narrow energy bandgap material) for each modulation-doped heterostructure.

In view of the brief description provided above, it should be clear to those skilled in the art that a semiconductor device realized in accordance with the principles of the present invention is suitable for incorporation within a waveguide structure as a waveguide element such as an external modulator for a light source, or as an intra-cavity wavelength tuning element coupled to a gain medium to produce a tunable laser, or as an intra-cavity modulator for directly modulated light source, or even as an optically-pumped laser. The illustrative embodiments of the present invention are described in the exemplary context of planar semiconductor waveguides. Various surface rib, buried rib and stripe geometry structures are contemplated for use with the present invention.

While it is desirable to operate a device in accordance with the principles of the invention with the light directed along longitudinal axis of the waveguide, it is understood that the semiconductor structure can also operate primarily as an electroabsorption modulator when the light impinges in a direction substantially perpendicular to the semiconductor layers of the device. Such a configuration is shown both in FIG. 2 and FIG. 3. In a vertical light propagation structure, the cascaded modulation-doped heterostructures can produce a sufficiently large phase-space absorption quenching (PAQ) effect that the structure can be used for optical reading, optical modulation, optical gating and has applicability to optical interconnects, optical switching, and optical computing.

Figure 2:
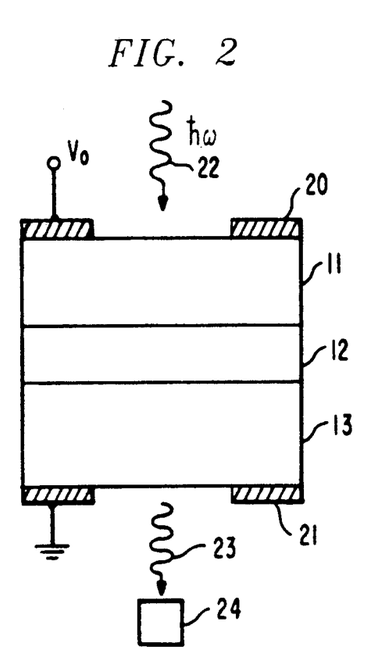
FIGS. 2 and 3 are cross-sectional views of a semiconductor device in accordance with the principles of the invention in which light impinges on the device in a direction perpendicular to the cascadable modulation-doped heterostructures.

In FIG. 2, optical signal 22 having a mean photon energy $h\omega$ below the energy of the absorption band edge for cladding regions 11 and 13 impinges on a device substantially perpendicular to the semiconductor layers. Modulated optical signal 23 emerges from the semiconductor device for subsequent utilization by element 24. Element 24 may be a lensed optical fiber, or photodetector or the like. In order to permit ingress and egress of optical signals perpendicular to the semiconductor layers, it is desirable to fabricate contacts 20 and 21 as standard annular ring contacts. Since absorption of optical signal 22 is substantially proportional to the length traversed by the optical signal in the absorbing material, the device shown in FIG. 2 provides a relatively small amount of absorption.

Figure 3:
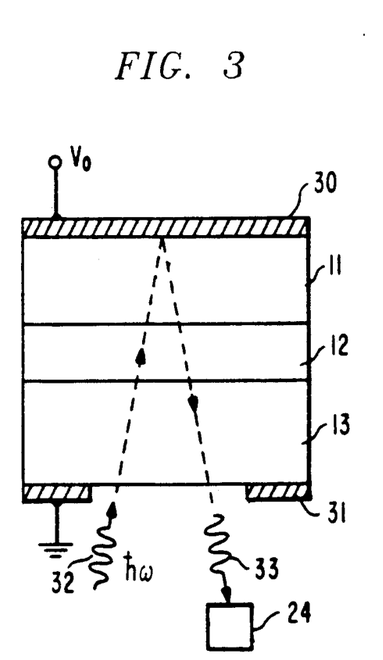

In order to effectively increase the distance over which the optical signals are absorbed, optical signals entering a device perpendicular to or at an angle slightly displaced from normal to the semiconductor layers may be reflected back from an opposite side of the device to traverse the absorbing material for a second time. Such a device is shown in FIG. 3. Optical signal 32 having a mean photon energy $h\omega$, which is in the transparency regions for cladding regions 11 and 13, impinges on a device substantially perpendicular to the semiconductor layers. The once-modulated optical signal is reflected by electrode 30 back through the absorbing material to finally emerge as modulated optical signal 33. In this configuration, contact 30 is realized as a stripe contact 31 is in the form of a standard annular ring contact.

While waveguide embodiments have been shown in FIGS. 1–3, it will become apparent to those skilled in the art that the present invention may be practiced by depositing the cascaded modulation-doped heterostructures between two doped contact layers. For the example shown in FIGS. 4–8, the contact layers would be doped n-type. An exemplary waveguide semiconductor structure is grown on a substrate comprising semi-insulating Fe doped InP. The lower cladding layer comprises a 1 $\mu$m thick, n-type layer of $Al_{0.48}In_{0.52}As$ doped to a concentration of approximately $2\times10^{18}$ $cm^{-3}$ and is grown on the substrate. A superlattice is grown on the lower cladding layer to provide a gradual transition between the modulation-doped heterostructures in the waveguide region and the cladding region. The superlattice comprises the following layers which are doped n-type to a concentration of approximately $2\times10^{18}$ $cm^{-3}$: an AlGaInAs layer (50 Å); an $Al_{0.48}In_{0.52}As$ layer (50 Å); an AlGaInAs layer (100 Å); an $Al_{0.48}In_{0.52}As$ layer (50 Å); an AlGaInAs layer (200 Å); and an $Al_{0.48}In_{0.52}As$ layer (50 Å). The cascaded modulation-doped heterostructures together with the associated buffer layers are grown above the superlattice. Another superlattice is then grown over the cascaded heterostructures with its layers being n-doped to a concentration of $2\times10^{18}$ $cm^{-3}$. This superlattice comprises the following layers: an $Al_{0.48}In_{0.52}As$ layer (50 Å); an AlGaInAs layer (200 Å); an $Al_{0.48}In_{0.52}As$ layer (50 Å); an AlGaInAs layer (100 Å); an $Al_{0.48}In_{0.52}As$ layer (50 Å); and an AlGaInAs layer (50 Å). Above the latter superlattice is grown an n-type upper cladding layer comprising $Al_{0.48}In_{0.52}As$ (2 $\mu$m) doped with silicon to a concentration of $2\times10^{18}$ $cm^{-3}$. Finally, a heavily doped n-type contact layer is grown comprising $Al_{0.48}In_{0.52}As$ (1000 Å) doped with silicon to a concentration of $5\times10^{18}$ $cm^{-3}$.

Figure 4:
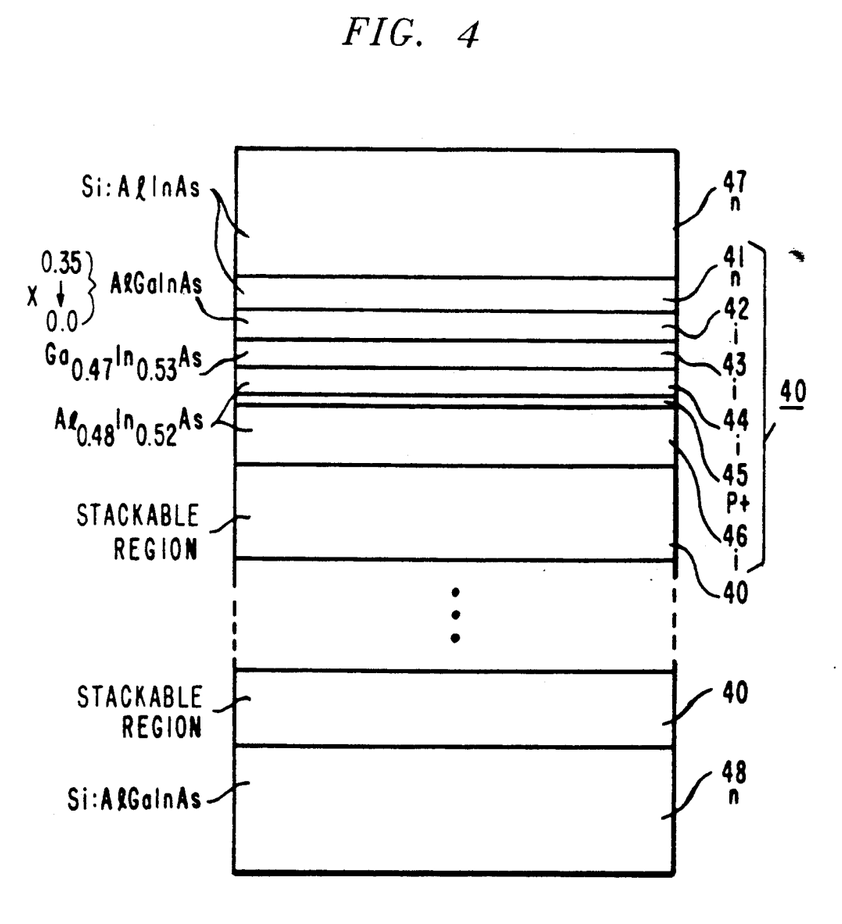
FIG. 4 is a cross-sectional view of semiconductor layers comprising cascaded modulation-doped graded bandgap heterostructures.

As shown in FIG. 4, a semiconductor structure suitable for use as a waveguide region 12 in FIGS. 1–3 includes several modulation-doped heterostructures 40 cascaded or stacked one atop the other and doped buffer layers 47 and 48. At least one buffer layer, namely, layer 48, is provided to complete the periodic n-i-n sequence of the semiconductor structure. Buffer layer 48 comprises InAs grown to a thickness of approximately 1 $\mu$m and having a doping concentration of Si at approximately $1\times10^{18}$ $cm^{-3}$. Modulation-doped heterostructure 40 is epitaxially grown on layer 48. Doped buffer layer 47 comprising AlGaInAs doped n-type with silicon with a concentration of $1\times10^{18}$ $cm^{-3}$ is grown to a thickness of approximately 1 $\mu$m over the uppermost cascaded modulation-doped heterostructure. Buffer layer 47 also provides a means for transition from the waveguiding region into the cladding region.

Each modulation-doped heterostructure 40 comprises semiconductor layers grown according to the following sequence: an isolation barrier region, an active region, and a charge reservoir and transfer barrier region. The isolation barrier region comprises layers 44 through 46; and the charge reservoir and transfer barrier regions comprise layers 41 and 42. In the isolation barrier region, layer 46 comprises intrinsic $Al_{0.48}In_{0.52}As$ grown to a thickness of 150 Å; p+ doping layer 45 comprises either atomic planar layer doping ($\delta$ doping with, e.g., Be) or conventional uniform doping of a p-type dopant to a concentration of approximately $1.2\times10^{18}$ $cm^{-3}$ which corresponds to conventional uniform doping using Be in 150 Å thick $Al_{0.48}In_{0.52}As$; and layer 44 comprises intrinsic $Al_{0.48}In_{0.52}As$ grown to a thickness of 250 Å. In the active region, layer 43 comprises narrow bandgap intrinsic material such as $Ga_{0.47}In_{0.53}As$ grown to a thickness of approximately 350 Å. In the charge reservoir and transfer barrier region, layer 42 comprises intrinsic quaternary composition $Q(x)$ grown to the thickness of approximately 350 Å; and layer 41 comprises $Q(x)$ doped within n-type material (Si) to a concentration of approximately $1\times10^{18}$ $cm^{-3}$ and grown to a thickness of approximately 500 Å. Quaternary material $Q(x)$ is a quaternary alloy wherein x refers to the mole fraction for $Q(x)$ defined as $(Al_{0.48}In_{0.52}As)_x \cdot (Ga_{0.47}In_{0.53}As)_{1-x}$. For layer 41, the mole fraction is approximately equal to 0.35 which is a wide bandgap composition whereas, for layer 42, the mole fraction is varied from approximately 0.35 to 0.0 as depicted in FIG. 4 to achieve continuous compositional grading from wide to narrow bandgap composition and substantially matching bandgap energies at the interface to adjacent layers.

Figure 5:
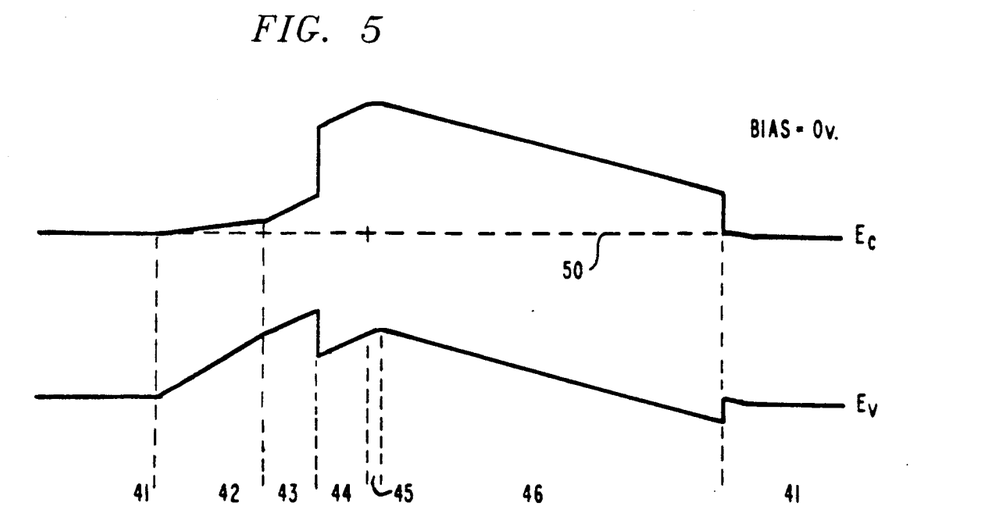
FIGS. 5 and 6 are energy band profiles of a single modulation-doped heterostructure under varying bias potential conditions in accordance with the principles of the invention.
Figure 6:
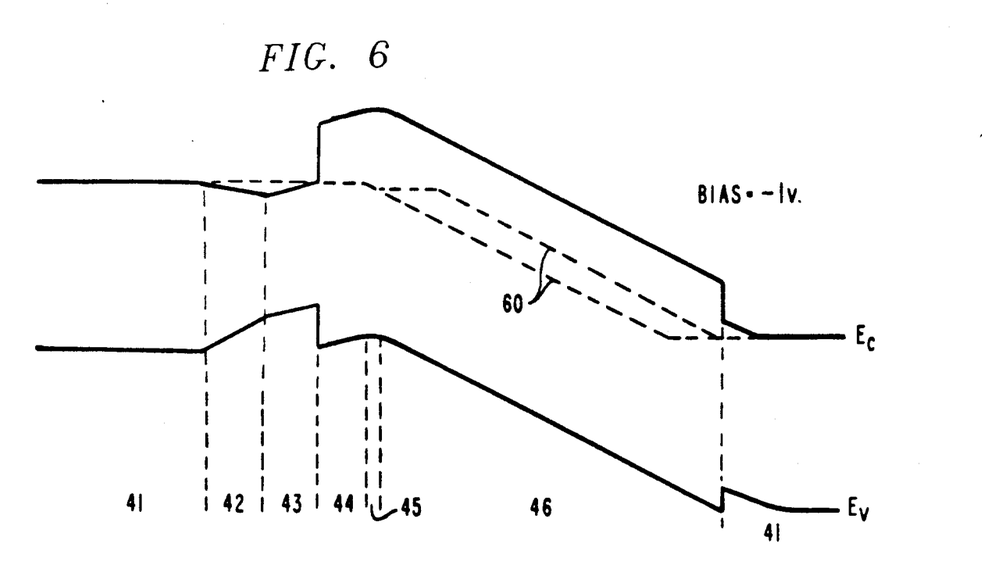
Figure 7:
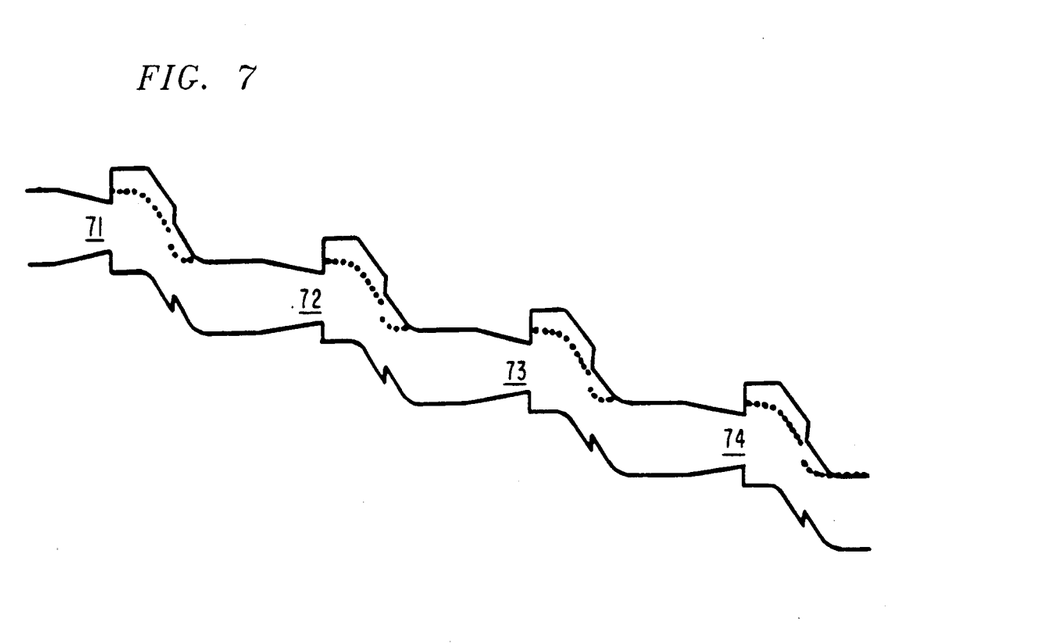
FIG. 7 shows an energy band profile for four modulation-doped graded bandgap heterostructures cascaded together in accordance with the principles of the present invention.

As shown in the energy band profiles in FIGS. 5 through 10, it is clear that modulation-doped heterostructure 40 includes semiconductor materials which are properly engineered to have substantially identical boundary conditions at opposite ends of the heterostructure to permit cascading or stacking of one modulation-doped heterostructure on top of another. As shown in FIG. 7, four modulation-doped heterostructures shown as periodic sections 71 through 74 are cascaded to form waveguide region 12 of a semiconductor waveguide device.

With respect to the p-doped layer 45 within modulation-doped heterostructure 40, it should be noted that the p layer is fully depleted to avoid free carrier absorption due to holes and to provide a large potential barrier to electron transport or leakage current from one modulation-doped heterostructure to the next. See FIG. 7 for an understanding of the isolation barrier in the periodic structure. As a result of including a large isolation barrier region, the modulation-doped heterostructure avoids unnecessary energy dissipation.

FIGS. 5 and 6 show energy band profiles for a single period of the modulation-doped heterostructure 40 when the semiconductor device is unbiased and reverse biased, respectively. In FIG. 5, the Fermi level (dashed line 50) is situated below the electron subband $n_z=1$ of the layer 43. Hence, the layer is initially empty of carriers. When an external bias is applied to the waveguide device, as shown in FIG. 6, a bias across modulation-doped heterostructure 40 of approximately $-1$ volt, the Fermi level (dashed line 60) rises above the electron subband $n_z=1$ level to cause electrons to fill layer 43 producing large changes in the optical characteristics of the material in the active region of the heterostructure. An insignificantly small amount of current may leak through the potential barrier formed in the isolation barrier region by layers 44 and 46 by p+ doping layer 45. As the electron subband levels fill, the absorption band edge undergoes a "blue shift" thereby quenching absorption of light whose photon energy is less than or equal to the energy of the electron subband $n_z=1$ in layer 43. By designing the heterostructure to have a partially full active region in the electron subband $n_z=1$, it is possible to induce absorption by application of a bias potential. Heterostructure 40 is polarization independent in that it neither favors nor discriminates against either of two orthogonal lightwave signal polarizations (e.g., TE or TM) propagating in the waveguide device.

Proper engineering of the isolation barrier region ensures that electrons are the only carriers contributing to the conduction and absorption processes. As a result of the proper barrier design, it is possible to have the associated charge carrier reservoir within the modulation-doped heterostructure be the only source of charge carriers for the active region with which reservoir is in close proximity. As the barrier region is made thinner, it is possible to produce the same effect with a lower applied potential. However, it is anticipated that the capacitance of the heterostructure and the leakage current will be increased.

As stated above, the resulting devices are capable of operating at a very high intrinsic speed. This occurs because charge carriers (electrons) need only be transferred over distances of several hundred angstrom rather than the comparatively larger distances in the modulation-doped FET structures of the prior art. An additional benefit of the heterostructure is that it possesses relatively low capacitance. When the modulation-doped heterostructures are cascaded (stacked) as described herein, the capacitance is further reduced because successive heterostructures are connected in series.

When a potential ($V_0$) is applied to the waveguide device incorporating the heterostructures, the potential is equally divided across each modulation-doped heterostructure. As a result, each modulation-doped heterostructure in a cascaded stack is substantially simultaneously and synchronously controllable by the electrical bias and, therefore, the corresponding active regions are all simultaneously depleted or filled.

Figure 8:
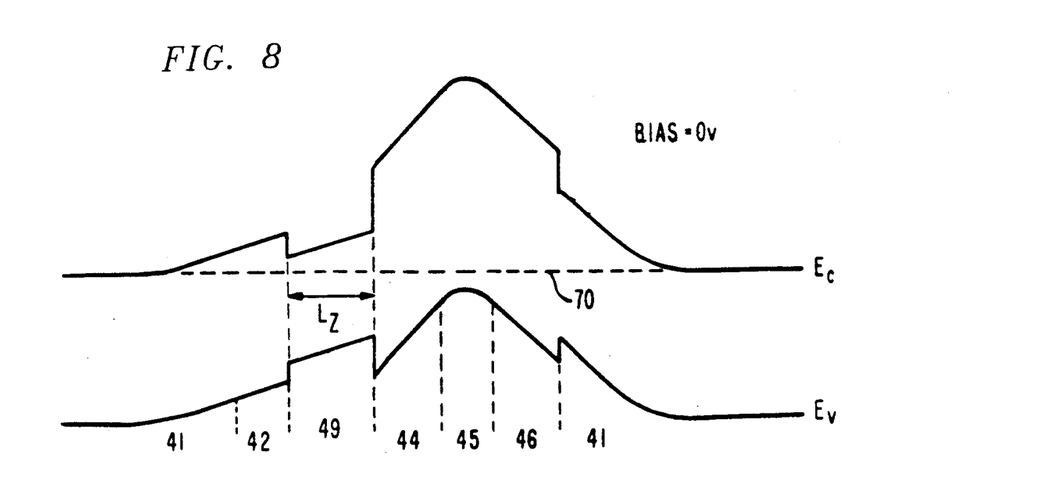
FIGS. 8, 9 and 10 are energy band profiles of additional alternative embodiments of a single modulation-doped heterostructure under zero bias condition in accordance with the principles of the invention.
Figure 9:
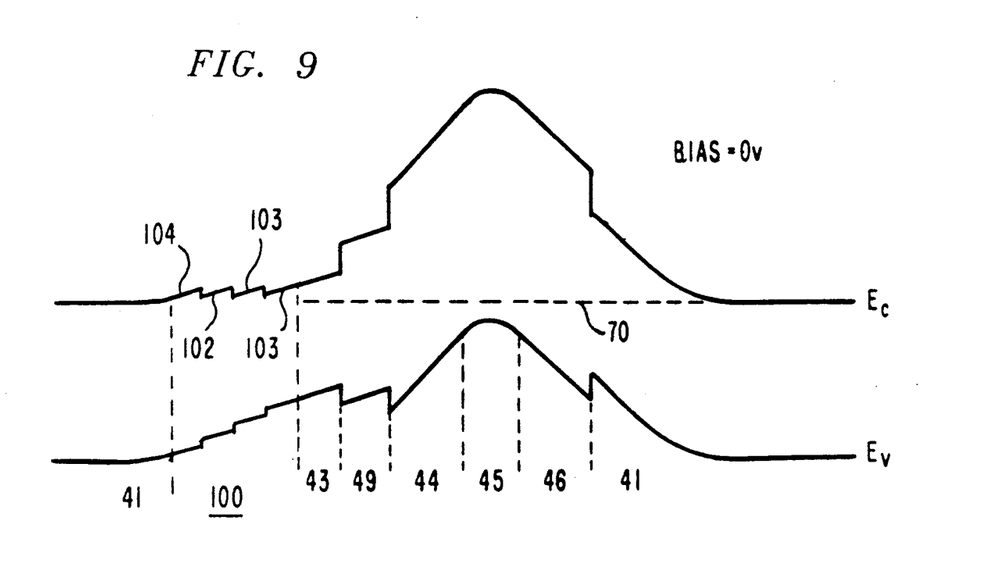
Figure 10:
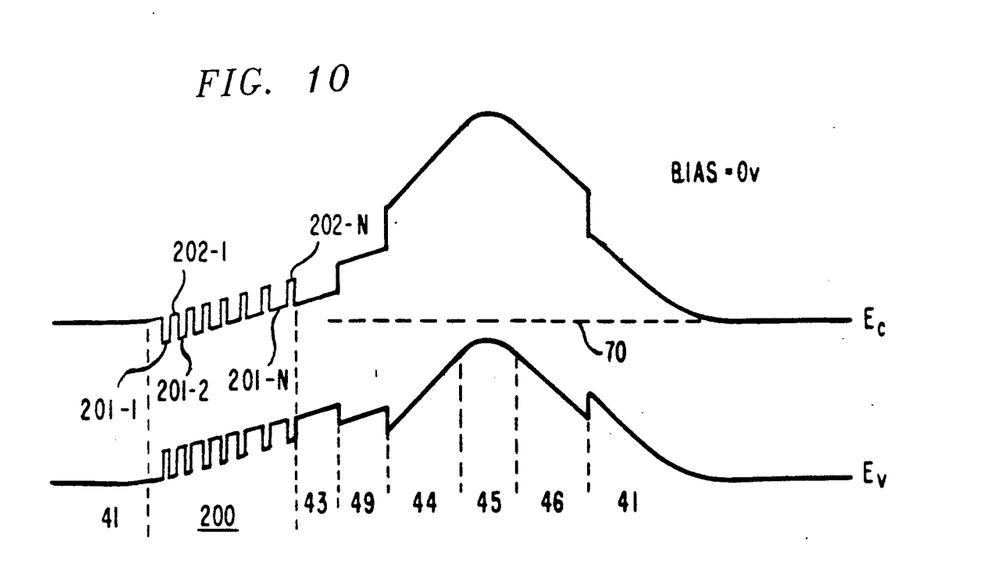

FIGS. 8, 9 and 10 show energy band profiles for a single period including the unbiased modulation-doped heterostructure designed in accordance with the principles of the present invention.

As stated above, the reservoir and transfer barrier region shown in FIGS. 4 through 7 comprises a continuously graded bandgap layer wherein the mole fraction of an alloy composition is varied in a predetermined monotonically nonincreasing manner from one interface to the next. In the example described above, a quaternary material $Q(x)$ is varied in from $x=0.35$ to $x=0.0$ wherein the variation of x is substantially linear as a function of distance along the growth direction. It is contemplated that other functions such as quadratic, piecewise linear, and step-wise linear may be employed to describe the variation of x as a function of distance along the growth direction.

In FIG. 9, a step-wise linear variation of the mole fraction x occurs in transfer barrier region 100 for layers 101, 102, 103, and 104. In this region, the bandgap energy is progressively narrowed in discrete steps from layer 101 ($x=0.35$) to layer 102 ($x=0.22$) to layer 103 ($x=0.12$) to layer 104 ($x=0$) by changing the material composition for each layer. While only four discrete step layers are shown, it is understood by those skilled in the art that fewer layers (steps) or even more layers (steps) can be utilized to achieve or approximate a graded bandgap. Steps may be of an equal value so that the discrete grading can approximate a quadratic or other function shape rather than a linear ramp function. Moreover, it is understood that discrete layers of constant bandgap can be interleaved with layers of continuously graded bandgap to achieve grading of the transfer barrier. While it may be desirable to match bandgap boundary conditions for region 100 with the bandgap of layer 41 at one interface and active region 43 at the other interface, it is not necessary to do so. For a significantly unmatched bandgap boundary condition at the interface between region 100 and the active region 43, that is, a bandgap mismatch of greater than 10 meV, it is desirable to have an active region thickness $L_z$ which exceeds twice the exciton Bohr radius for the material comprising the active region. In this regime, the narrow bandgap active region will appear as a well, that is, a thick narrow bandgap layer between two wide bandgap layers, but it will fail to be a quantum well because it will not trigger band splitting effects which arise only for quantum wells.

When it is not desirable or feasible to vary the mole fraction of a compound to achieve continuous or discrete compositional grading as described above, it is possible to effect bandgap variation by superlattice grading. Superlattice grading is well known to those skilled in the art and is described in R. C. Miller et al., *Physical Review B*, Vol. 29, No. 6, March 1984, pp. 3740–3. In superlattice grading, n layers of a wide bandgap material $Q(x=0.35)$ and n layers of a narrow bandgap material $Q(x=0.0)$ are alternated as shown in region 200 of FIG. 10. The n narrow bandgap layers are labelled from 201-1 to 201-n whereas the n wide bandgap layers are labelled from 202-1 to 202-n. Wide bandgap layers 202-1 to 202-n are sufficiently thin to achieve electron tunneling. Typical thicknesses for the wide bandgap layers in Group III–V material are less than approximately 30 Å. Viewed from the interface with layer 41 to the interface with the active region 43, the narrow bandgap layers 201-1 through 201-n are grown progressively thicker to achieve an effective composition grading. As a result, the heterostructure in FIG. 10 behaves in a substantially identical manner to the heterostructures described in FIGS. 4 and 9.

Except as noted above, the thickness of the active layer 43 may be set over a wide range of values. The thickness of this layer affects the amount of refraction or absorption which occurs for a propagating optical signal. Moreover, it establishes the polarization independence of the device. When the active layer 43 thickness is being established, it is necessary to consider it as it exists in the heterostructure. That is, when considered between the isolation barrier region and the transfer barrier region, the active region is sufficiently thick to preserve polarization independence without producing any appreciable splitting between valence bands.

In FIG. 8, the active region 49 is formed as a thick narrow bandgap layer (e.g., $Q(x=0)$) whose thickness $L_z$ is greater than twice the exciton Bohr radius for the narrow bandgap material. Layer 42 is a wide bandgap bulk layer (e.g., $Q(x=0.35)$). Because of the bandgap inequality at the interface between the transfer barrier region and the active region, active region 49 appears as a well between two high barrier regions. However, polarization independence is maintained by controlling the thickness of the active region.

While it has not been shown in the FIGs., it is understood by those skilled in the art an intrinsic wide bandgap spacer layer may be interposed between the active region and the isolation barrier region. This positions the active region farther away from the isolation barrier region. By positioning the active layer farther away from the barrier layer, it is possible to adjust the degree of filling experienced by electron subband $n_z=1$ in the active layer both with and without an external biased potential.

It is contemplated that a $\delta$ doped n-type layer may be grown at the interface with the isolation barrier layer (interface between layers 43 and 44; interface between layers 49 and 44) to reduce the built in field in the reservoir layer. It is further contemplated that the device structure may include one or more periods of the cascadable modulation-doped interrupted by a separate doped semiconductor layer (which may be contacted) with another cascaded set of modulation-doped heterostructures following thereon. Such a structure would permit individual control of the separate stacks of heterostructures.

The devices described above may be fabricated by standard epitaxial processing techniques such as molecular beam epitaxy and vapor phase epitaxy such as metal organic chemical vapor deposition. Fabrication techniques including semiconductor layer growth, impurity doping, atomic planar layer or delta impurity doping, photolithography and contact metallization to realize a device in accordance with the principles of the invention described above are believed to be well known to those persons of ordinary skill in the art.

It is understood that, while the material system InGaAs/InGaAlAs is described above for fabricating the electrically controlled semiconductor device having cascaded modulation-doped semiconductor heterostructures, other material combinations may be selected from other semiconductor Group III-V systems such as GaAs/AlGaAs, InGaAs/InAlAs, GaAs/AlAs, GaAsSb/GaAlAsSb and InGaAsP/InP. In these semiconductor systems, the layers may be lattice-matched to suitable GaAs or InP substrates. Mismatching is also contemplated wherein strained layers are grown over the substrate material. Finally, extension of the device structures is also contemplated to semiconductor compounds in Group II-VI and Group IV.

We claim:

1. A semiconductor device responsive to electrical signals for causing a change to a supplied optical signal comprising at least a first modulation-doped structure including epitaxial regions grown in sequence as follows: a doped charge reservoir region comprising a first semiconductor material, an intrinsic transfer barrier region, an active region comprising a second semiconductor material wherein a bandgap energy for said second semiconductor material is less than a bandgap energy for said first semiconductor material, an isolation barrier region for substantially inhibiting carrier flow from said active region through said isolation barrier region including first and second layers of intrinsic third semiconductor material and a third doped layer between said first and second layers wherein said doped charge reservoir region and said third doped layer exhibit opposite type conductivity, and a doped boundary region comprising said first semiconductor material for substantially matching a boundary condition for the conduction and valence bands at an outer end of the doped boundary region to a boundary condition for the conduction and valence bands at an outer end of the doped charge reservoir region, said doped boundary region and said doped charge reservoir region having similar conductivity types, and said transfer barrier region includes layers comprising at least fourth and fifth semiconductor materials having different respective energy bandgaps and arranged to provide effective grading of the bandgaps from said doped charge reservoir region to said active region.

2. The semiconductor device as defined in claim 1 wherein said transfer barrier region includes a plurality of layers having different energy bandgaps, said plurality of layer arranged to effect substantially continuous compositional grading from said bandgap energy of said reservoir region to the bandgap energy of the active region.

3. The semiconductor device as defined in claim 1 wherein said transfer barrier region includes a plurality of layers having different energy bandgaps, said plurality of layers arranged to effect substantially continuous compositional grading from said bandgap energy of said reservoir region to a bandgap energy greater than the bandgap energy of the active region, and said active region having a thickness greater than twice the exciton Bohr radius.

4. The semiconductor device as defined in claim 1 wherein said transfer barrier region includes a plurality of layers having different energy bandgaps, said plurality of layers arranged to effect substantially stepwise linear compositional grading from said bandgap energy of said reservoir region to the bandgap energy of the active region.

5. The semiconductor device as defined in claim 1 wherein said transfer barrier region includes a plurality of layers having different energy bandgaps, said plurality of layers arranged to effect substantially stepwise linear compositional grading from said bandgap energy of said reservoir region to a bandgap energy greater than the bandgap energy of the active region, and said active region having a thickness greater than twice the exciton Bohr radius.

6. The semiconductor device as defined in claim 1 wherein said transfer barrier region includes a plurality of narrow bandgap layers and a corresponding plurality of wider bandgap layers arranged in alternating sequence to form a graded superlattice wherein the thickness of the plurality of narrow bandgap layers increases in the sequence from the reservoir region to the active region and the thickness of the wider bandgap region is sufficiently small to permit electron tunneling therethrough, and said narrow bandgap layers having an energy bandgap greater than or equal to the bandgap energy of said active region.

7. The semiconductor device as defined in claim 6 wherein the plurality of wider bandgap layers has an energy bandgap substantially equal to the energy bandgap of the reservoir region.

8. The semiconductor device as defined in claim 1 wherein said active region has a thickness greater than twice the exciton Bohr radius.

9. The semiconductor device as defined in claim 3 wherein said modulation-doped structure further includes an intrinsic spacer layer epitaxially grown between said barrier region and said active region.

10. A semiconductor device responsive to electrical signals for causing a change to a supplied optical signal comprising at least first and second modulation-doped structures wherein each said modulation-doped structure includes epitaxial regions grown in sequence as follows: a doped charge reservoir region comprising a first semiconductor material, an intrinsic transfer barrier region, an active region comprising a second semiconductor material wherein a bandgap energy for said second semiconductor material is less than a bandgap energy for said first semiconductor material, an isolation barrier region for substantially inhibiting carrier flow from said active region through said isolation barrier region including first and second layers of intrinsic third semiconductor material and a third doped layer between said first and second doped layers wherein said doped charge reservoir region and said third doped layer exhibit opposite type conductivity, and a doped boundary region comprising said first semiconductor material for substantially matching a boundary condition for the conduction and valence bands at an outer end of the doped boundary region to a boundary condition for the conduction and valence bands at an outer end of the doped charge reservoir region, said doped boundary region and said doped charge reservoir region having similar conductivity types, and said transfer barrier region includes layers comprising at least fourth and fifth semiconductor materials having different respective energy bandgaps and arranged to provide effective grading of the bandgaps from said doped charge reservoir region to said active region.

11. The semiconductor device as defined in claim 10 wherein said transfer barrier region includes a plurality of layers having different energy bandgaps, said plurality of layers arranged to effect substantially continous compositional grading from said bandgap energy of said reservoir region to the bandgap energy of the active region.

12. The semiconductor device as defined in claim 11 wherein said transfer barrier region includes a plurality of layers having different energy bandgaps, said plurality of layers arranged to effect substantially continuous compositional grading from said bandgap energy of said reservoir region to a bandgap energy greater than the bandgap energy of the active region, and said active region having a thickness greater than twice the exciton Bohr radius.

13. The semiconductor device as defined in claim 10 wherein said transfer barrier region includes a plurality of layers having different energy bandgaps, said plurality of layers arranged to effect substantially stepwise linear compositional grading from said bandgap energy of said reservoir region to the bandgap energy of the active region.

14. The semiconductor device as defined in claim 10 wherein said transfer barrier region includes a plurality of layers having different energy bandgaps, said plurality of layers arranged to effect substantially stepwise linear compositional grading from said bandgap energy of said reservoir region to a bandgap energy greater than the bandgap energy of the active region, and said active region having a thickness greater than twice the exciton Bohr radius.

15. The semiconductor device as defined in claim 10 wherein said transfer barrier region includes a plurality of narrow bandgap layers and a corresponding plurality of wider bandgap layers arranged in alternating sequence to form a graded superlattice wherein the thickness of the plurality of narrow bandgap layers increases in the sequence from the reservoir region to the active region and the thickness of the wider bandgap region is sufficiently small to permit electron tunneling therethrough, and said narrow bandgap layers having an energy bandgap greater than or equal to the bandgap energy of said active region.

16. The semiconductor device as defined in claim 15 wherein the plurality of wider bandgap layers has an energy bandgap substantially equal to the energy bandgap of the reservoir region.

17. The semiconductor device as defined in claim 16 wherein said active region has a thickness greater than twice the exciton Bohr radius.

18. The semiconductor device as defined in claim 1 wherein said modulation-doped structure further includes an intrinsic spacer layer epitaxially grown between said barrier region and said active region.

19. The semiconductor device as defined in claim 10 wherein said modulation-doped structure further includes an intrinsic spacer layer epitaxially grown between said barrier region and said active region.

20. A semiconductor device responsive to electrical signals for causing a change to a supplied optical signal comprising at least first and second modulation-doped structures wherein each said modulation-doped structure includes epitaxial regions grown in sequence as follows: a doped charge reservoir region comprising a first semiconductor material, an intrinsic transfer barrier region having an energy bandgap substantially equal to the energy bandgap of said reservoir region, an active region comprising a second semiconductor material wherein a bandgap energy for said second semiconductor material is less than a bandgap energy for said first semiconductor material and having a thickness greater than twice the exciton Bohr radius, an isolation barrier region for substantially inhibiting carrier flow from said active region through said isolation barrier region including first and second layers of intrinsic third semiconductor material and a third doped layer between said first and second doped layers wherein said doped charge reservoir region and said third doped layer exhibit opposite type conductivity, and a doped boundary region comprising said first semiconductor material for substantially matching a boundary condition for the conduction and valence bands at an outer end of the doped boundary region to a boundary condition for the conduction and valence bands at an outer end of the doped charge reservoir region, said doped boundary region and said doped charge reservoir region having similar conductivity types.

* * * * *